(12) United States Patent
Wingerter

(10) Patent No.: US 9,448,275 B2
(45) Date of Patent: Sep. 20, 2016

(54) FAULT DETECTION OF FOUR WIRE VARIABLE DIFFERENTIAL TRANSFORMER SENSORS

(71) Applicant: THE BOEING COMPANY, Chicago, IL (US)

(72) Inventor: Richard J. Wingerter, Bridgeton, MO (US)

(73) Assignee: The Boeing Company, Chicago, IL (US)

( * ) Notice: Subject to any disclaimer, the term of this patent is extended or adjusted under 35 U.S.C. 154(b) by 116 days.

(21) Appl. No.: 13/926,837

(22) Filed: Jun. 25, 2013

(65) Prior Publication Data

US 2014/0375331 A1  Dec. 25, 2014

(51) Int. Cl.
| G01D 5/12 | (2006.01) |
| G01R 31/28 | (2006.01) |
| G01D 5/22 | (2006.01) |
| G01D 5/244 | (2006.01) |

(52) U.S. Cl.
CPC ............ G01R 31/282 (2013.01); G01D 5/12 (2013.01); G01D 5/2291 (2013.01); G01D 5/24457 (2013.01)

(58) Field of Classification Search
CPC ............... G01R 31/28; G01R 31/282; G01R 31/31835; G01R 31/44; G01R 11/25; G01R 22/068; G01R 1/22; G01R 15/183; G01D 5/12; G01D 5/2291; G01D 5/24457
USPC ................. 324/537, 11–207.25, 500
See application file for complete search history.

(56) References Cited

U.S. PATENT DOCUMENTS

| 5,767,670 | A |  | 6/1998 | Maher et al. |
| 5,777,468 | A | * | 7/1998 | Maher .................. G01D 5/2291 318/657 |
| 7,395,044 | B2 |  | 7/2008 | Horikawa |
| 2007/0146942 | A1 | * | 6/2007 | Covington et al. ............. 361/38 |
| 2012/0286820 | A1 | * | 11/2012 | Brahmavar ............... 324/764.01 |
| 2012/0290238 | A1 |  | 11/2012 | Nair et al. |
| 2014/0306719 | A1 | * | 10/2014 | Dunsmore et al. ........... 324/601 |

OTHER PUBLICATIONS

Introductory Circuit Analysis Boyland, Robert 1987 p. 387.*
"2(R) Description of Actuation Systems for Aircraft With Fly-By-Wire Flight Control Systems," Aerospace Information Report, SAE Aerospace, AIR4253, Rev. B, Issued Apr. 1989, Revised Aug. 2012, 160 pages.

* cited by examiner

*Primary Examiner* — Son Le
*Assistant Examiner* — Brent J Andrews
(74) *Attorney, Agent, or Firm* — Duft Bornsen & Fettig LLP

(57) ABSTRACT

Apparatus and methods of detecting failures in systems having a four-wire variable differential transformer sensor. In one embodiment, a method of detecting failures includes monitoring a source frequency of an Alternating Current (AC) voltage applied to an input of a four-wire variable differential transformer sensor, and monitoring an output frequency for an output of the sensor. The method further includes comparing the output frequency with the source frequency, and detecting a failure if the output frequency is different than the source frequency.

20 Claims, 5 Drawing Sheets

FAULT DETECTION OF FOUR WIRE VARIABLE DIFFERENTIAL TRANSFORMER SENSORS

FIELD

This disclosure relates to the field of displacement sensors, and more particularly, to four wire Rotary Variable Differential Transformer (RVDT) sensors or Linear Variable Differential Transformer (LVDT) sensors.

BACKGROUND

Displacement sensors are used in a variety of applications to measure the displacement of an object. Displacement sensors may measure a linear displacement of objects, or may measure a rotary displacement of objects. One type of displacement sensors operate on the principal of a transformer, and are referred to as Rotary or Linear Variable Differential Transformer sensors, hereinafter referenced as RVDT sensors, LVDT sensors, or collectively referenced as R/LVDT sensors.

An LVDT sensor, in one exemplary configuration, includes a primary winding that is wound around a hollow form. The LVDT sensor also includes secondary windings that are wound around the hollow form overlapping or on either side of the primary winding. As a power source applies an AC voltage to the primary winding, the magnetic flux produced by the primary winding is coupled to the secondary windings. This induces an AC voltage in each of the secondary windings. The LVDT sensor also includes a core that is able to move along a linear axis within the hollow form. The core of the LVDT sensor is attached in some manner to the object whose displacement is being measured. As the core moves within the hollow form due to movement of the object, the primary winding will be more strongly coupled to one of the secondary windings. The differential voltage across the secondary windings therefore indicates a displacement of the core in the LVDT sensor.

A four-wire LVDT sensor includes two input wires for the primary winding, and two output wires for the secondary windings. The output wires allow for a measurement of the differential voltage across the two secondary windings. One problem with four-wire R/LVDT sensors is that it is difficult to determine when these sensors have failed. This is because, when the core of the R/LVDT sensor is in a neutral or intermediate position between the two secondary windings, the primary winding will be equally coupled to each of the secondary windings so that the secondary windings will have the same voltage amplitude and an opposite phase. Thus, when the differential voltage across the secondary windings is demodulated into a DC voltage, the DC voltage will be zero volts. Because zero volts is a valid output, it can be difficult to directly detect a failure in a four-wire R/LVDT sensor.

SUMMARY

One or more embodiments described herein provide an apparatus and methods for detecting failures in four-wire R/LVDT systems, by exploiting the continuous measurement and monitoring of frequency in the sensor output. Because an R/LVDT sensor is based on the principal of a transformer, the frequency applied to the input of the R/LVDT sensor will be present in the output of the R/LVDT sensor if the system is operating correctly. Thus, to detect a failure of an R/LVDT system, the apparatus and methods described herein compare the frequency of the input signal to the R/LVDT sensor with the frequency (if present) of the output signal from the R/LVDT sensor. If the frequencies do not match or if no frequency is present in the output signal, then an assumption may be made that there is a failure in the R/LVDT sensor, the wiring to and from the R/LVDT sensor, or the components providing the excitation and demodulation of the signals. Thus, by comparing the output frequency of an R/LVDT sensor with its input frequency, failures in an R/LVDT system may be directly detected.

One embodiment comprises a method of detecting a failure in a system having a four-wire variable differential transformer sensor, such as an RVDT or an LVDT sensor. The method includes monitoring a source frequency of an Alternating Current (AC) voltage applied to an input of the sensor, and monitoring an output frequency of the sensor. The method further includes comparing the output frequency with the source frequency, and detecting a failure if the output frequency is different than the source frequency. The failure may be in the sensor, wiring to and from the sensor, components providing the AC voltage, etc.

Another embodiment comprises an apparatus configured to detect a failure in a system having a four-wire variable differential transformer sensor. The apparatus includes a frequency monitor coupled to the sensor. The frequency monitor is configured to monitor a source frequency of an AC voltage applied to an input of the sensor, and to monitor an output frequency of the sensor. The frequency monitor is further configured to compare the output frequency with the source frequency, and to detect a failure if the output frequency is different than the source frequency.

Yet another embodiment comprises a method, which includes the step of monitoring a plurality of channels that each have a four-wire variable differential transformer sensor configured to measure a displacement of an object. The method further includes determining a validity for each of the channels by monitoring a source frequency of an AC voltage applied to an input of the sensor, monitoring an output frequency of the sensor, comparing the output frequency with the source frequency, and detecting a failure if the output frequency is different than the source frequency. The method further includes shutting off a channel if a failure is detected in the sensor of the channel.

The features, functions, and advantages that have been discussed can be achieved independently in various embodiments or may be combined in yet other embodiments further details of which can be seen with reference to the following description and drawings.

DESCRIPTION OF THE DRAWINGS

Some configurations of the present disclosure are now described, by way of example only, and with reference to the accompanying drawings. The same reference number represents the same element or the same type of element on all drawings.

DESCRIPTION

The figures and the following description illustrate specific exemplary embodiments of the methods and apparatus disclosed. It will thus be appreciated that those skilled in the art will be able to devise various arrangements that, although not explicitly described or shown herein, embody the principles described herein and are included within the contemplated scope of the claims that follow this description. Furthermore, any examples described herein are intended to aid in understanding the principles of the disclosure, and are to be construed as being without limitation. As a result, this disclosure is not limited to the specific embodiments or examples described below, but by the claims and their equivalents.

Figure 1:
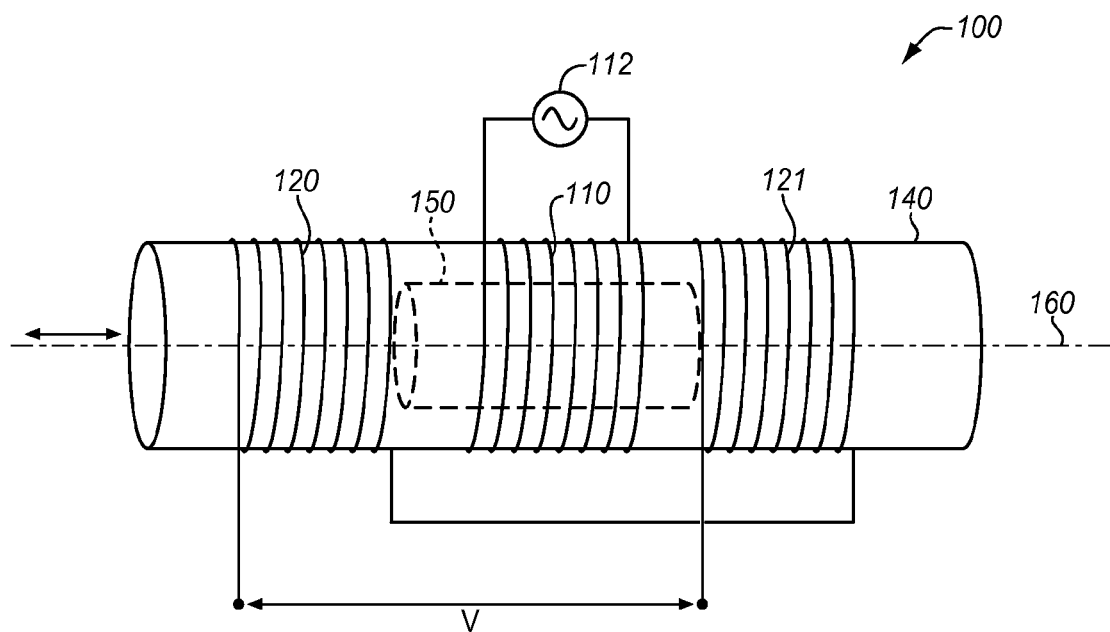
FIG. 1 illustrates a four-wire LVDT sensor.

FIG. 1 illustrates a typical four-wire LVDT sensor 100. LVDT sensor 100 includes primary winding 110 that is wound around a hollow form 140. Primary winding 110 is connected to an AC voltage source 112 for powering LVDT sensor 100. LVDT sensor 100 also includes secondary windings 120-121 that are also wound around hollow form 140 on opposing sides of primary winding 110. Secondary windings 120-121 are connected in series opposition to produce an output voltage (V) which is the difference of the voltages in each of the secondary windings 120-121. LVDT sensor 100 also includes a core 150 that is allowed to move along a linear axis 160 within hollow form 140. In use, core 150 is connected in some manner to an object (not shown), such as a component part of an aircraft, whose displacement is being measured.

To operate LVDT sensor 100, power source 112 applies an input AC voltage to LVDT sensor 100. The magnetic flux produced in primary winding 110 induces an AC voltage in each of the secondary windings 120-121. When core 150 is centered in a neutral or zero position between secondary windings 120-121, the voltage amplitude in each secondary winding 120-121 is equal. Because secondary windings 120-121 are series-opposed, the AC voltage in each secondary winding 120-121 will be 180 degrees out of phase. Therefore, the in-phase amplitude of the differential voltage (V) measured across the secondary windings 120-121 will approach zero volts when core 150 is centered between secondary windings 120-121. But, the differential voltage across the secondary windings 120-121 will still exhibit a measureable frequency due to the phenomenon of quadrature voltage.

If core 150 moves to the left in FIG. 1, then the magnetic coupling between primary winding 110 and secondary winding 120 increases and the coupling between primary winding 110 and secondary winding 121 decreases. When the coupling between primary winding 110 and secondary winding 120 is stronger, the differential voltage between secondary windings 120-121 will be in-phase with the input AC voltage. And, the amplitude of the output voltage indicates how strongly coupled the core 150 is to secondary winding 120, which indicates the displacement of core 150 to the left in FIG. 1.

If core 150 moves to the right in FIG. 1, then the magnetic coupling between primary winding 110 and secondary winding 121 increases and the coupling between primary winding 110 and secondary winding 120 decreases. When the coupling between primary winding 110 and secondary winding 121 is stronger, the differential voltage between secondary windings 120-121 will be out-of-phase with the input AC voltage. And, the amplitude of the output voltage will indicate how strongly coupled the core 150 is to secondary winding 121, which indicates the displacement of core 150 to the right in FIG. 1.

Figure 2:
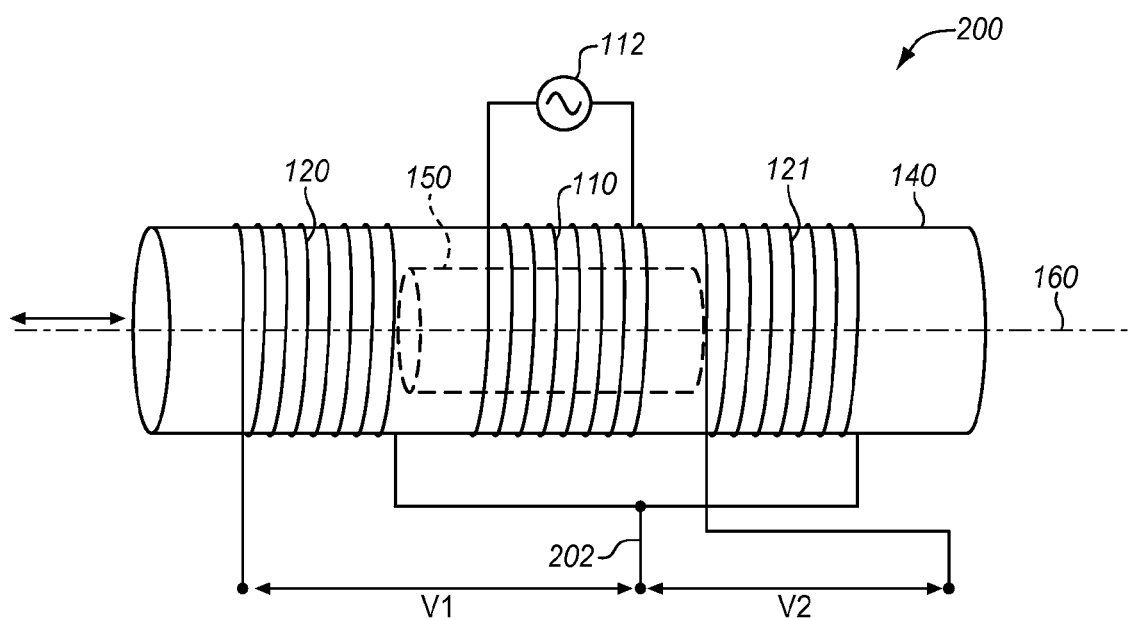
FIG. 2 illustrates a five-wire LVDT sensor.

FIG. 2 illustrates a five-wire LVDT sensor 200. A five-wire LVDT sensor 200 has a similar structure as a four-wire LVDT sensor 100. However, a five-wire LVDT sensor 200 includes a center tap 202 between secondary windings 120-121. When there is a center tap 202 as in FIG. 2, a voltage (V1) may be measured across secondary winding 120, and a separate voltage (V2) may be measured across secondary winding 121. The differential voltage (V1–V2) can therefore be directly measured or calculated for the five-wire LVDT sensor 200.

The configuration of a five-wire LVDT sensor 200 provides an easier way to directly detect a fault in sensor 200. The primary winding 110 in LVDT sensor 200 will induce a voltage in both secondary windings 120-121 under normal conditions. Because a five-wire LVDT sensor 200 has a center tap 202, an individual voltage can be measured over each secondary winding 120-121. Thus, a measurement of zero volts over either secondary winding 120-121 is indicative of a failure in five-wire LVDT sensor 200. However, a four-wire LVDT sensor 100 as in FIG. 1, only outputs a differential voltage between two secondary windings 120-121. An individual voltage cannot be measured over each secondary winding 120-121 of a four-wire LVDT sensor to detect a fault, while such a measurement can be taken from a five-wire LVDT sensor 200. This makes it more difficult to directly measure a fault in a four-wire LVDT sensor 100.

Figure 3:
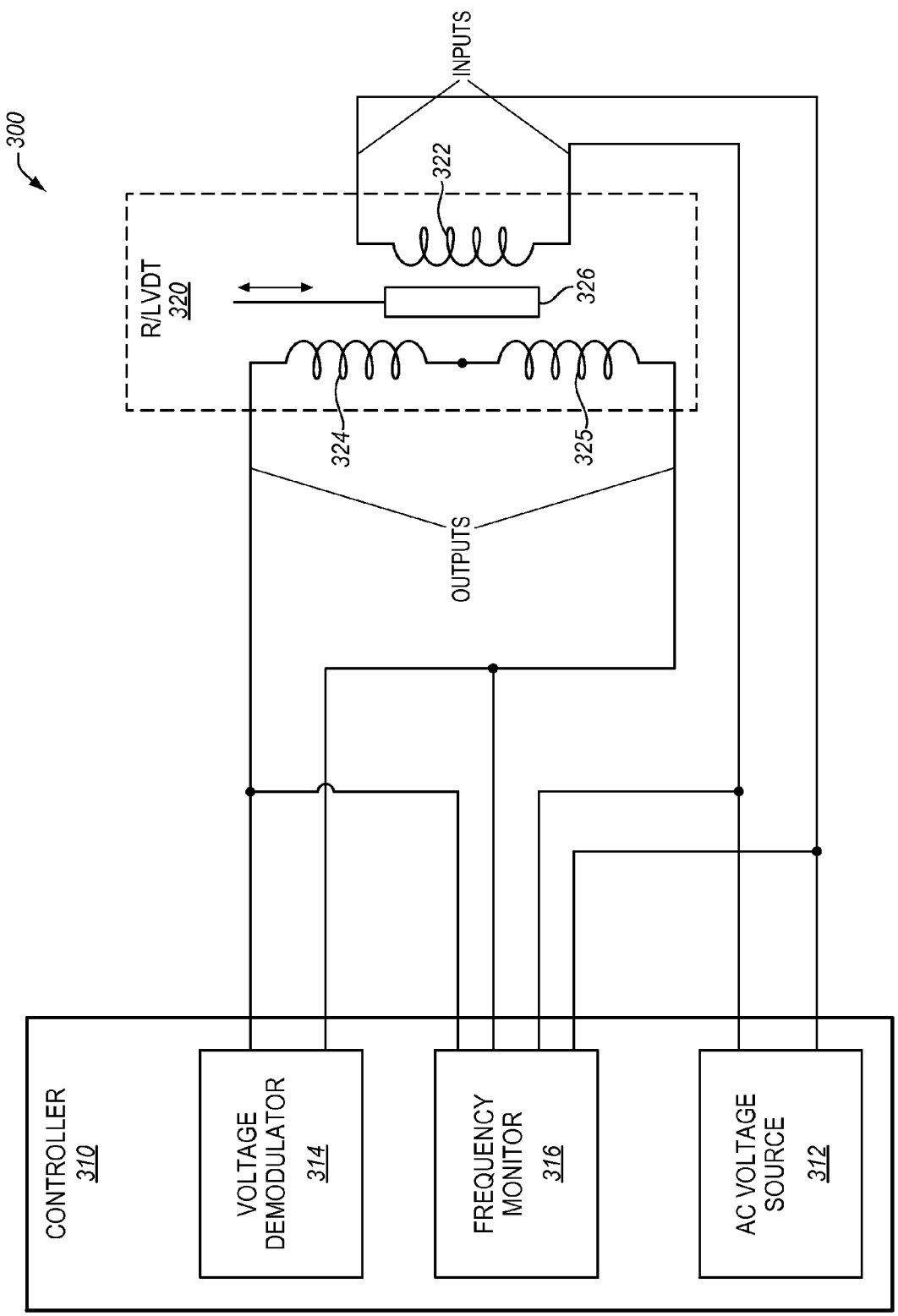
FIG. 3 is a schematic diagram of a system that includes a four-wire R/LVDT sensor in an exemplary embodiment.
Figure 4:
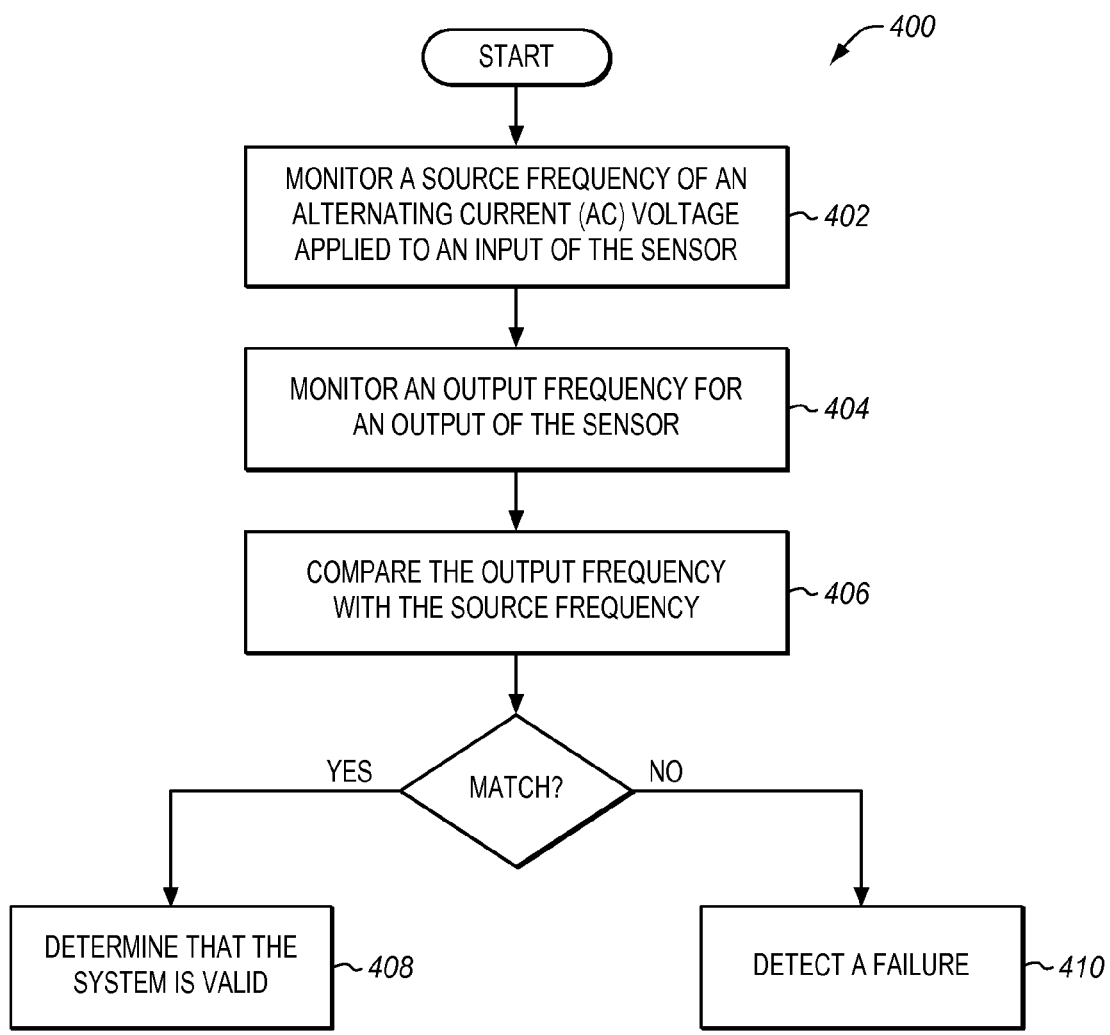
FIG. 4 is a flow chart illustrating a method of detecting a failure in a four-wire R/LVDT system in an exemplary embodiment.

The embodiments described herein provide an apparatus and method of detecting failures in systems that use a four-wire R/LVDT sensor by measuring a frequency in an output signal of the four-wire R/LVDT sensor, which is further described in FIGS. 3-4.

FIG. 3 is a schematic diagram of a system 300 that includes a four-wire R/LVDT sensor in an exemplary embodiment. System 300 includes a controller 310 coupled to an R/LVDT sensor 320. R/LVDT sensor 320 is illustrated schematically as having a primary winding 322 and two secondary windings 324-325. R/LVDT sensor 320 also includes a core 326 that is able to move linearly along an axis as indicated by the arrow in FIG. 3 (such as for an LVDT), or revolve around an axis (such as for an RVDT). R/LVDT sensor 320 includes two input wires and two output wires, so R/LVDT sensor 320 is considered a "four-wire" sensor. An R/LVDT "system" refers to the R/LVDT sensor 320, the wiring between R/LVDT sensor 320 and controller 310, and the components within controller 310.

Controller 310 includes an AC voltage source 312 that is connected to the two inputs of R/LVDT sensor 320. AC voltage source 312 is configured to power R/LVDT sensor 320 with an AC voltage. Controller 310 also includes a voltage demodulator 314 that is connected to the two outputs of R/LVDT sensor 320. Voltage demodulator 314 is a component that processes the output (i.e., AC waveform) of R/LVDT sensor 320 to generate a DC voltage. Voltage demodulator 314 processes the amplitude and phase of the AC waveform output from R/LVDT sensor 320 to generate a DC voltage that is proportional to the displacement of core 326.

Controller 310 also includes a frequency monitor 316 that is connected to the output of R/LVDT sensor 320, and is also connected to the input of R/LVDT sensor 320. Frequency monitor 316 is a component that is able to determine whether a failure has occurred in system 300 by monitoring and comparing the frequency of the AC waveform present in the input and output of R/LVDT sensor 320. Because R/LVDT sensor 320 operates on the principal of a transformer, the frequency of the input AC signal to R/LVDT sensor 320 will be induced into the secondary windings 324-325 under normal conditions. Therefore, the output signal from R/LVDT sensor 320 will exhibit the frequency of the input signal if R/LVDT sensor 320 is operating correctly. By comparing the output frequency of R/LVDT sensor 320 with the input source frequency, frequency monitor 316 is able to identify failures in system 300.

FIG. 4 is a flow chart illustrating a method 400 of detecting a failure in a system having a four-wire R/LVDT sensor in an exemplary embodiment. The steps of method 400 will be described with respect to controller 310 in FIG. 3, although one skilled in the art will understand that the methods described herein may be performed by other devices or systems not shown. The steps of the methods described herein are not all inclusive and may include other steps not shown.

In step 402, frequency monitor 316 monitors, measures, or identifies a source frequency of the AC voltage applied to the input of R/LVDT sensor 320. In step 404, frequency monitor 316 monitors, measures, or identifies an output frequency of R/LVDT sensor 320. The output frequency is the dominate frequency measured on the output signal of R/LVDT sensor 320. The dominant frequency will be the frequency having the highest amplitude in the frequency domain. In step 406, frequency monitor 316 compares the output frequency with the source frequency. If the output frequency matches the source frequency, then frequency monitor 316 determines that R/LVDT sensor 320 or system 300 is valid. In other words, frequency monitor 316 determines that there is no failure present in system 300, and that the output of R/LVDT sensor 320 may be considered a valid output.

If the output frequency is different than the source frequency, then frequency monitor 316 detects a failure in system 300. The output frequency is considered "different" than the source frequency if the output frequency and the source frequency do not match, or if there is no frequency present on the output signal from R/LVDT sensor 320. The failure may be in R/LVDT sensor 320, wiring to and from R/LVDT sensor 320, in AC voltage source 312, in voltage demodulator 314, etc.

Method 400 advantageously provides a way to detect failures in a system that uses a four-wire R/LVDT sensor. The existence of the source frequency in the output signal from a four-wire R/LVDT sensor can be used as an indicator that the individual four-wire R/LVDT sensor is working correctly. Many failures of a four-wire R/LVDT sensor involve short circuits or open circuits of the wiring, connectors, or internal sensor coils (windings). If failures such as these occur, the source frequency would not be present in the output signal from the R/LVDT sensor. Therefore, by verifying the presence of the source frequency in the output signal from the R/LVDT sensor, frequency monitor 316 is able to determine that short or open circuits do not exist in the system.

When measuring the displacement of an object, four-wire R/LVDT systems may be used in a redundant fashion. For example, three or four R/LVDT sensors may be connected to the same object to measure the displacement of the object. Redundant R/LVDT configurations may be used in aircraft or other systems where critical components are used. The methods and apparatus for detecting failures in individual four-wire R/LVDT sensors as described herein can be implemented in redundant R/LVDT configurations as depicted in FIGS. 5-6.

Figure 5:
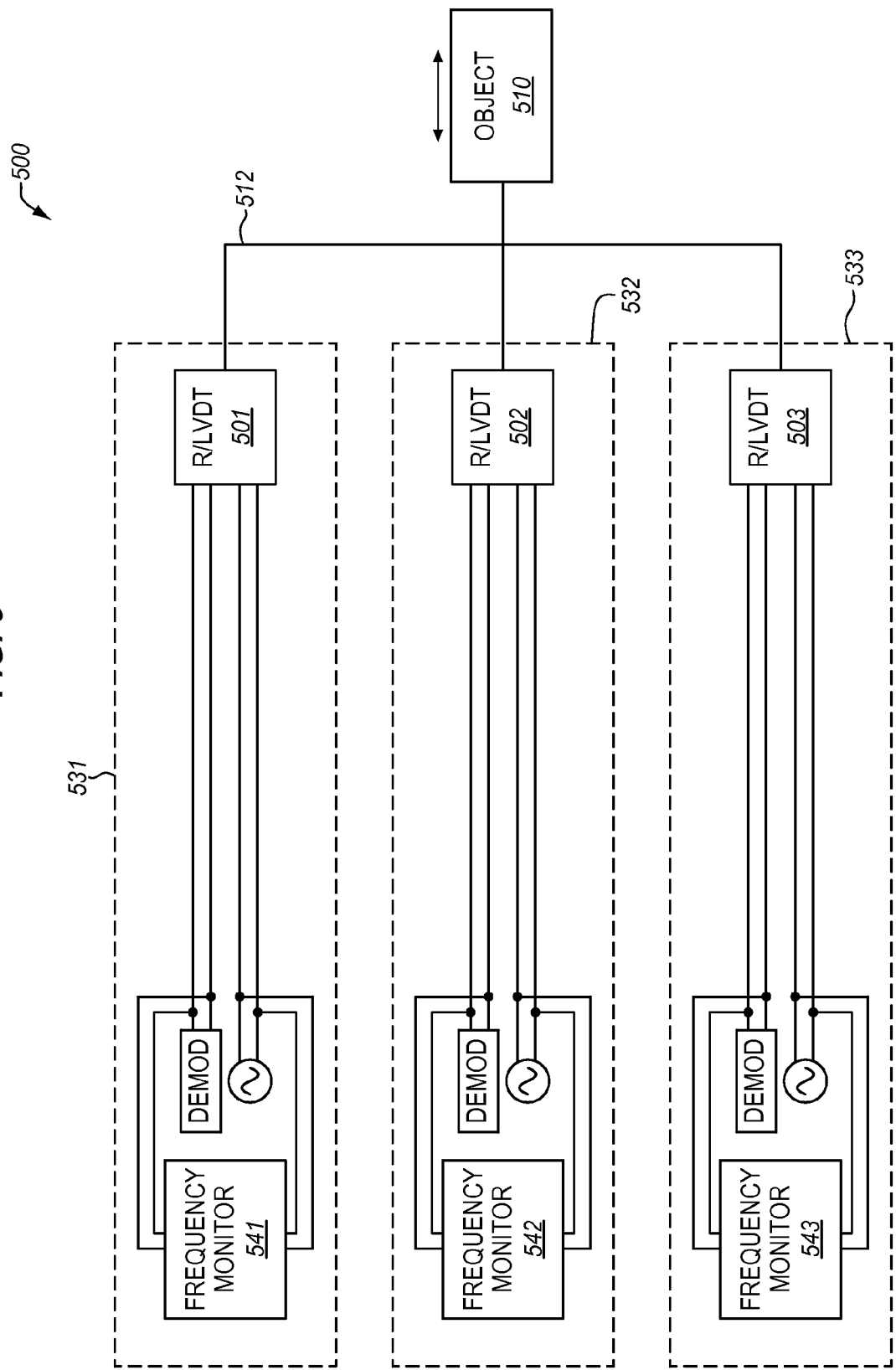
FIG. 5 is a schematic diagram of a system having redundant four-wire R/LVDT sensors in an exemplary embodiment.

FIG. 5 is a schematic diagram of a system 500 having redundant four-wire R/LVDT sensors in an exemplary embodiment. System 500 illustrates a plurality of four-wire R/LVDT sensors 501-503 connected to an object 510 through a connection member 512 to measure a displacement of object 510. Although three R/LVDT sensors 501-503 are shown in FIG. 5, system 500 may include more R/LVDT sensors. Each R/LVDT sensor 501-503 in FIG. 5 forms an independent "channel" for measuring the displacement of object 510. A channel includes an R/LVDT sensor, an AC power source of a specified frequency that powers the R/LVDT sensor, and a voltage demodulator (DEMOD) that processes the output of the R/LVDT sensor. Thus, three channels 531-533 are illustrated in FIG. 5. Each of the channels uses a source frequency that is separated by guard bands. For example, each channel may use a source frequency that is separated by a fixed amount, such as 90 Hz, 95 Hz, 100 Hz, etc.

Each channel 531-533 also includes a frequency monitor 541-543. Within each channel 531-533, frequency monitor 541-543 is connected to the AC power source and voltage demodulators similar to the way that frequency monitor 316 is connected in FIG. 3. Each frequency monitor 541-543 is able to directly detect failures in the individual channels having R/LVDT sensors 501-503, and determine which channels 531-533 are valid or should be shut down due to failure.

Figure 6:
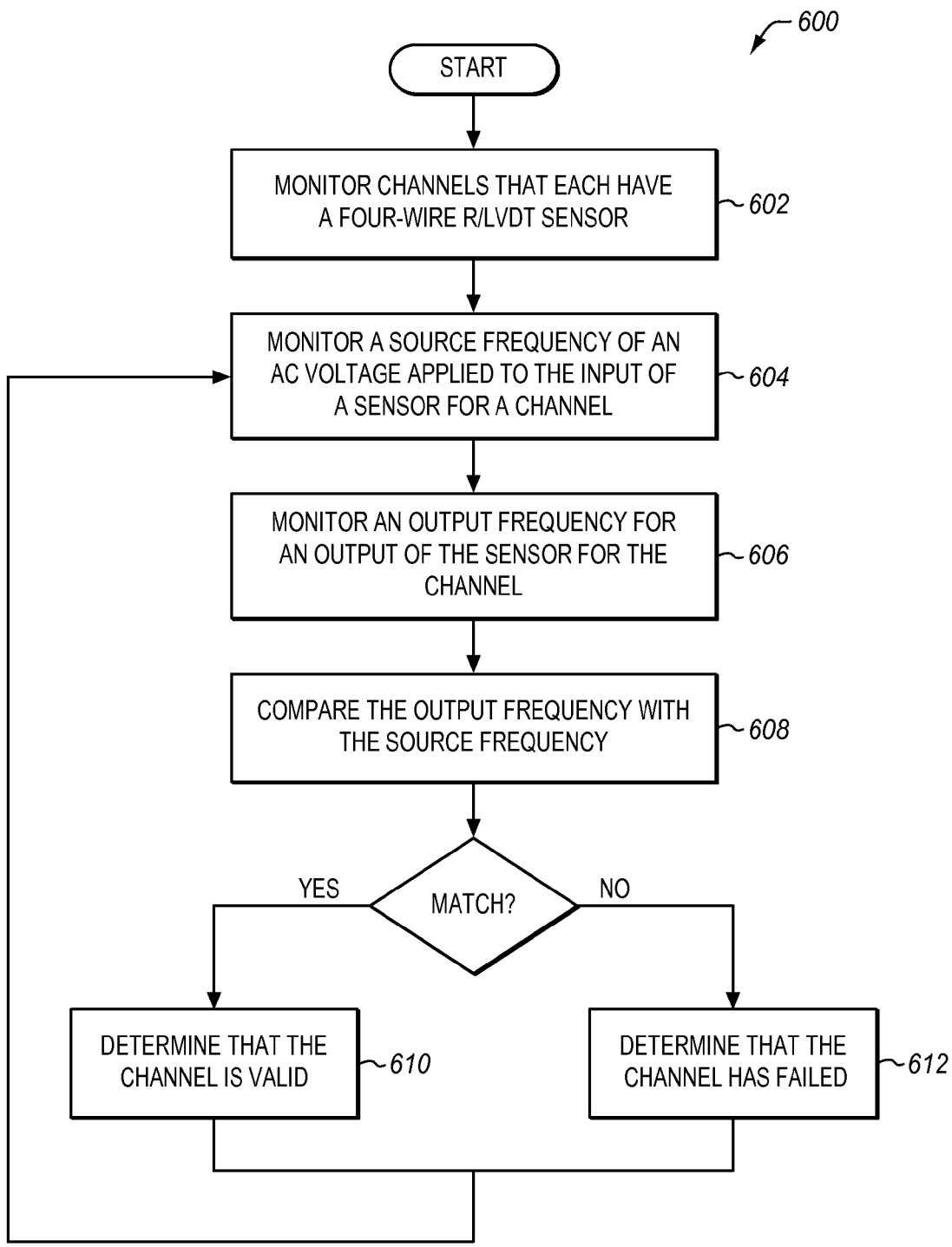
FIG. 6 is a flow chart illustrating a method of detecting failures in channels of a redundant four-wire R/LVDT configuration in an exemplary embodiment.

FIG. 6 is a flow chart illustrating a method 600 of detecting failures in channels of a redundant four-wire R/LVDT configuration in an exemplary embodiment. The steps of method 600 will be described with respect to system 500 in FIG. 5, although one skilled in the art will understand that the methods described herein may be performed by other devices or systems not shown.

In step 602, frequency monitors 541-543 monitor their respective channels 531-533 each having a four-wire R/LVDT sensor 501-503. As part of monitoring channels 531-533, frequency monitors 541-534 determine the validity of their respective channels 531-533 by identifying which of the channels 531-533 is providing a valid output, or which of the channels 531-533 is providing a faulty output. This validity check may occur continually, periodically, or responsive to a specific request.

For each channel 531-533, frequency monitor 541-543 monitors a source frequency of the AC voltage applied to the input of the R/LVDT sensor for that channel (step 604). Frequency monitor 541-543 also monitors an output frequency for an output of the R/LVDT sensor for that channel (step 606). Frequency monitor 541-543 then compares the source frequency with the output frequency (step 608) of their channel. If the output frequency matches the source frequency, then frequency monitor 541-543 determines that the channel is valid (step 610). If the output frequency is different than the source frequency, then frequency monitor 541-543 determines that the channel has failed (step 612).

Based on the results of the validity determination performed by frequency monitors 541-543, a controller may determine which channels are providing a valid displacement measurement for object 510. For example, if a channel is determined to be valid, then the controller may utilize the output of that channel for a displacement measurement. If a failure is identified in a channel, then the controller may disregard the output of this channel, or shut this channel off due to a detected failure.

Any of the various components shown in the figures or described herein may be implemented as hardware, software, firmware, or some combination of these. For example, a component may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, a component may be implemented as instructions executable by a processor or a computer to perform the functions of the component. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific configurations were described herein, the scope is not limited to those specific configurations. Rather, the scope is defined by the following claims and any equivalents thereof.

The invention claimed is:

1. A method of detecting a failure in a system having a four-wire variable differential transformer sensor, wherein the four-wire variable differential transformer sensor includes a primary winding, secondary windings that are connected in series opposition, and a core that moves in relation to the secondary windings, the method comprising:
   measuring a source frequency of an Alternating Current (AC) source voltage applied to the primary winding of the four-wire variable differential transformer sensor;
   measuring an output frequency of a differential output voltage across the secondary windings of the four-wire variable differential transformer sensor;
   comparing the output frequency with the source frequency; and
   detecting a failure if the output frequency is different than the source frequency.

2. The method of claim 1 wherein:
   the four-wire variable differential transformer sensor comprises a four wire Linear Variable Differential Transformer (LVDT) sensor.

3. The method of claim 1 wherein:
   the four-wire variable differential transformer sensor comprises a four wire Rotary Variable Differential Transformer (RVDT) sensor.

4. The method of claim 1 wherein:
   the failure is in the four-wire variable differential transformer sensor.

5. The method of claim 1 wherein:
   the failure is in wiring to or from the four-wire variable differential transformer sensor.

6. The method of claim 1 wherein:
   the failure is in a component providing the AC source voltage to the four-wire variable differential transformer sensor.

7. An apparatus configured to detect a failure in a system having a four-wire variable differential transformer sensor, wherein the four-wire variable differential transformer sensor includes a primary winding, secondary windings that are connected in series opposition, and a core that moves in relation to the secondary windings, the apparatus comprising:
   a frequency monitor coupled to inputs across the primary winding, and coupled to outputs across the secondary windings;
   the frequency monitor is configured to measure a source frequency of an Alternating Current (AC) source voltage applied to the primary winding of the four-wire variable differential transformer sensor, to measure an output frequency of a differential output voltage across the secondary windings of the four-wire variable differential transformer sensor, to compare the output frequency with the source frequency, and to detect a failure if the output frequency is different than the source frequency.

8. The apparatus of claim 7 wherein:
   the four-wire variable differential transformer sensor comprises a four wire Linear Variable Differential Transformer (LVDT) sensor.

9. The apparatus of claim 7 wherein:
   the four-wire variable differential transformer sensor comprises a four wire Rotary Variable Differential Transformer (RVDT) sensor.

10. The apparatus of claim 7 wherein:
    the failure is in the four-wire variable differential transformer sensor.

11. The apparatus of claim 7 wherein:
    the failure is in wiring to or from the four-wire variable differential transformer sensor.

12. The apparatus of claim 7 wherein:
    the failure is in a component providing the AC source voltage to the four-wire variable differential transformer sensor.

13. A method comprising:
    monitoring a plurality of channels that each have a four-wire variable differential transformer sensor configured to measure a displacement of an object, wherein the four-wire variable differential transformer sensor includes a primary winding, secondary windings that are connected in series opposition, and a core that moves in relation to the secondary windings; and
    determining a validity for each of the channels by:
      measuring a source frequency of an Alternating Current (AC) source voltage applied to the primary winding of the four-wire variable differential transformer sensor for the channel;
      measuring an output frequency of a differential output voltage across the secondary windings of the four-wire variable differential transformer sensor for the channel;
      comparing the output frequency with the source frequency; and
      determining that the channel has failed if the output frequency is different than the source frequency for the four-wire variable differential transformer sensor.

14. The method of claim 13 further comprising:
    determining that the channel is valid if the output frequency matches the source frequency for the four-wire variable differential transformer sensor of the channel.

15. The method of claim 14 further comprising:
shutting off a channel responsive to a failure detected in the channel.

16. The method of claim 14 further comprising:
utilizing an output of a channel responsive to a determination that the channel is valid.

17. The method of claim 13 wherein:
the AC source voltage applied to the four-wire variable differential transformer sensors in each of the channels has a frequency that differs by a fixed amount.

18. The method of claim 13 wherein:
the four-wire variable differential transformer sensor comprises a four wire Linear Variable Differential Transformer (LVDT) sensor.

19. The method of claim 13 wherein:
the four-wire variable differential transformer sensor comprises a four wire Rotary Variable Differential Transformer (RVDT) sensor.

20. An apparatus comprising:
a plurality of four-wire variable differential transformer sensors configured to measure a displacement of an object, wherein the four-wire variable differential transformer sensors each include a primary winding, secondary windings that are connected in series opposition, and a core that moves in relation to the secondary windings;
wherein each four-wire variable differential transformer sensor is associated with a frequency monitor, a source frequency of Alternating Current (AC) voltage applied to inputs of each four-wire variable differential transformer sensor, and a demodulator coupled to outputs of each four-wire variable differential transformer sensor,
wherein the frequency monitor is configured to determine a validity of each four-wire variable differential transformer sensor by measuring the source frequency applied to the primary winding of the four-wire variable differential transformer sensor and an output frequency of a differential output voltage across the secondary windings of the four-wire variable differential transformer sensor, and comparing the output frequency with the source frequency to determine whether there is a difference indicating that the four-wire variable differential transformer sensor has failed.

* * * * *